United States Patent [19]

Wise

[11] Patent Number: 5,418,453

[45] Date of Patent: May 23, 1995

[54] METHOD OF MEASURING WHEEL SPEED SENSOR IMPEDANCE

[75] Inventor: William D. Wise, Flora, Ind.

[73] Assignee: Delco Electronics Corporation, Kokomo, Ind.

[21] Appl. No.: 149,401

[22] Filed: Nov. 9, 1993

[51] Int. Cl.[6] .................. G01P 3/42; G01R 31/27
[52] U.S. Cl. .................... 324/160; 324/525
[58] Field of Search .................. 324/207.12, 225, 236, 324/160, 173, 503, 525, 537, 713, 715, 718, 720; 188/181 R; 384/448

[56] References Cited

U.S. PATENT DOCUMENTS

| | | | |
|---|---|---|---|
| 4,876,527 | 10/1989 | Oka et al. | 324/160 |
| 5,019,774 | 5/1991 | Rosenberg | 324/174 |
| 5,130,933 | 7/1992 | Kitano | 324/160 |
| 5,250,909 | 10/1993 | Bitts | 324/503 |
| 5,291,133 | 3/1994 | Gokhale et al. | 324/207.12 |

*Primary Examiner*—Sandra L. O'Shea
*Assistant Examiner*—Roger C. Phillips
*Attorney, Agent, or Firm*—Mark A. Navarre

[57] ABSTRACT

A system for anti-lock brake and traction control has a control circuit comprising a microprocessor on a silicon die. Inputs from several variable reluctance wheel speed sensors are multiplexed to a single channel on the same die for signal processing including diagnostics, A/D conversion, square wave generation for each sensor by a state machine, and wheel speed determination from the square waves. The diagnostics include detecting sensor and harness short and open circuits by comparison of signals to programmable thresholds and fault timing and latching by gauging open and short signals against programmable time limits. Common mode noise rejection is accomplished by detecting common mode aberration and disabling an A/D converter during the aberrations. Other diagnostics include inputting known artificial signals at sensor inputs or wheel speed circuit inputs and checking for expected outputs, or by calculating wheel speed in parallel paths having the same square wave inputs and using different algorithms. Sensor and harness resistance is checked by retrieving differential voltages measured when the wheels are stationary, each voltage being a function of the sensor and harness resistance.

6 Claims, 3 Drawing Sheets

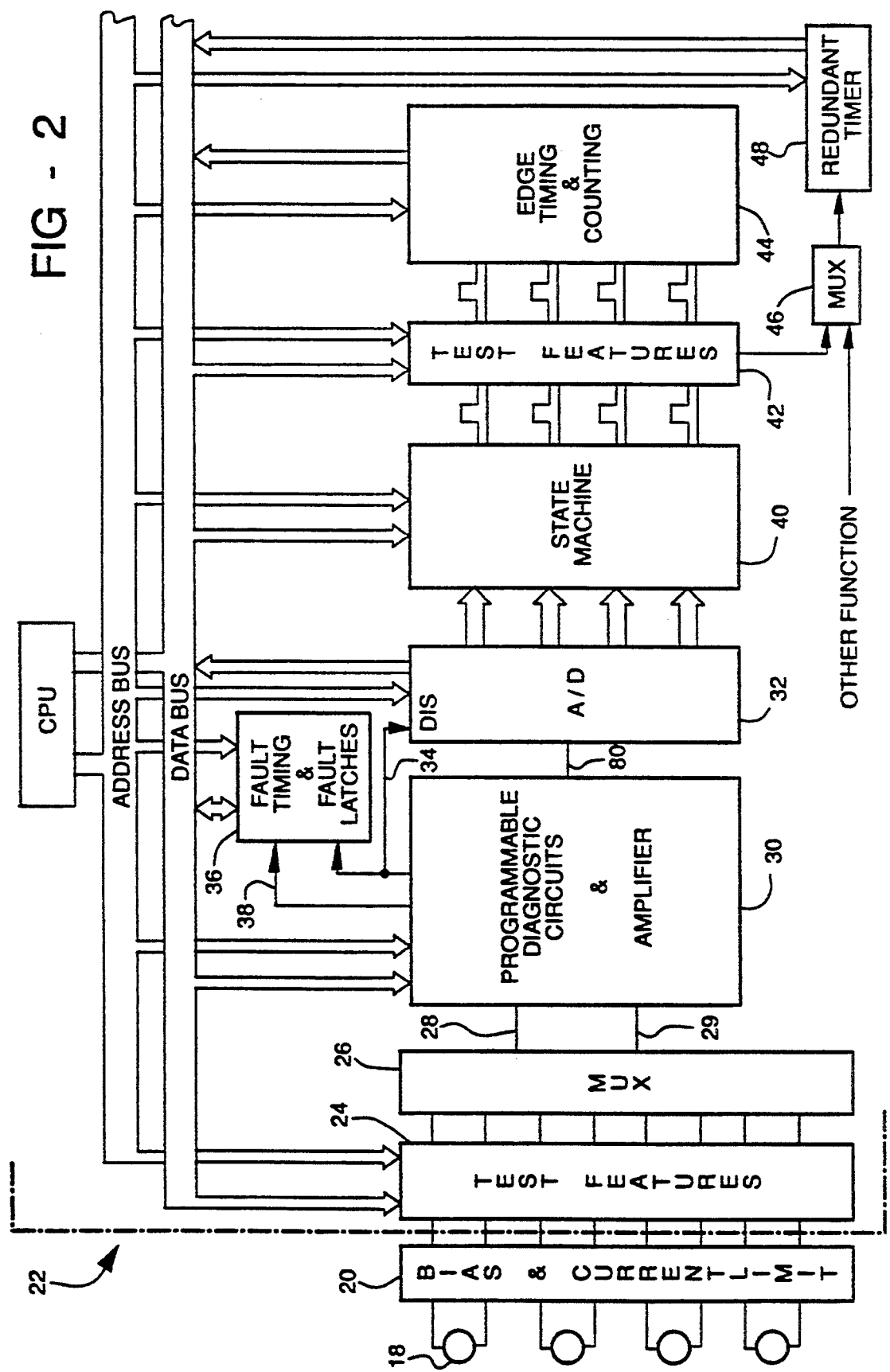

METHOD OF MEASURING WHEEL SPEED SENSOR IMPEDANCE

FIELD OF THE INVENTION

This invention relates to the diagnosing of wheel speed sensor and related harness and particularly to a method of measuring resistance of a sensor and harness in an anti-lock brake system.

BACKGROUND OF THE INVENTION

It is known in automotive vehicle control systems to utilize wheel speed information which is processed in a computer for operating a control such as anti-lock brakes or traction control. Frequently the wheel speed of all four wheels or of both front wheels and the average of the rear wheels are used for control purposes. In such cases three or four variable reluctance wheel speed sensors are fed to the computer control, each sensor having a separate channel for processing the wheel speed. The processing may include sensor and channel diagnostics, amplification, square wave generation, A/D conversion, and determination of each wheel speed. At some point in the process the signals are digitized and fed to the computer.

To the extent that the channels are separate, it is relatively easy for the computer to diagnose faulty operation in a sensor or channel: when the wheel speeds are expected to be equal, the channel outputs are compared and any deviant channel has an output different from the others. Verifying the processing occurring within the computer is more difficult. It has been proposed to use two microprocessors running in parallel so that one can be a check for the other. However, such large scale redundancy is expensive in terms of the amount of space required on a computer die.

To upgrade anti-lock brakes and traction control systems, it is here proposed to include on the computer die functions which previously have been accomplished separately. Yet because of the need to conserve space on the silicon die, the processing must be done efficiently and in some cases with less circuitry than used in more conventional systems. One feature is to multiplex the incoming sensor signals and process the signals through only one channel instead of three or four. This presents some challenges, for example, diagnostics of the external sensors, harnesses and processing channel no longer can rely on comparing one channel to another. New diagnostics, then, are needed not only for external circuits but for internal operations. An advantage to incorporating the input functions on the same die as the computer is that the computer is readily available for assisting with some of the processing or the diagnostics, affording some amenities not previously practical.

A diagnostic concern to service technicians is the resistance of the sensor and the sensor harness including connections. To determine whether the resistance is within a normal range, heretofore it has been necessary to remove the sensor harness from the controller and to make conventional resistance measurements.

SUMMARY OF THE INVENTION

It is therefore an object of the invention to obtain a measure of each sensor and its related harness resistance from the controller and without removing the harness from the controller. It is another object to determine sensor and harness resistance from the input signals.

The system which embodies the invention includes a particular way of biasing the variable reluctance wheel speed sensors so that shorts and opens as well as resistance in the sensors and harnesses can be diagnosed. A multiplex circuit is used to direct the outputs of each sensor, in turn, to an input instrumentation amplifier which is used to not only output a signal representing the differential sensor voltage but a common mode signal as well. The common mode signal ideally is constant but sensor shorts and input transients can cause abnormal variations. A window comparator with thresholds bracketing the normal common mode voltage is used to detect such variations. High and low sensor lead voltages must vary over a given range due to wheel movement or open circuit conditions. Open circuit conditions are detected by comparators set at certain thresholds. In each case when thresholds are exceeded, the comparator outputs are timed and a fault is indicated when a comparator time due to a short or an open exceeds a time limit. All of these thresholds and time limits are programmable to optimize the system for a particular application or for special diagnostics at the time of factory testing or servicing.

The output signal of the amplifier is digitized by an analog to digital converter and stored in a register for each sensor. The signal from the window comparator is fed forward to the converter to block conversion when the comparator has an output indicative of an aberrant common mode voltage due to either a short or a transient. The A/D converter output remains the same as long as the aberrant voltage is present, thereby avoiding passing on the transients. The A/D output stores the current digital values for the several sensors in separate registers.

A state machine is used to analyze the digital values and convert the nominal sine wave input to square waves. Since the inputs may vary greatly from ideal sine waves due to sensor runout or damaged sensor gear teeth, the irregular wave shapes are identified according to peaks and valleys, rather than zero crossings. Peaks and valleys are detected and a square wave edge is identified when the signal passes below a peak (or above a valley) by a hysteresis value. A dual hysteresis method is used to circumvent single cycle anomalies caused by a damaged tooth. Timing circuitry registers the time of occurrence of each edge and counts the number of edges which occur so that the control algorithm can compute wheel speed.

Each portion or component of the system other than the sensor and harness is under the control of a CPU and the signals developed by the A/D converter and stored as digital values in registers are accessible by the CPU. These values represent the instantaneous sensor voltages and can be recalled by a service technician when the vehicle is stationary. Each voltage is a function of a sensor resistance and its connecting harness so that a quantitative assessment of each sensor and harness resistance can be obtained without disconnecting the harness.

BRIEF DESCRIPTION OF THE DRAWINGS

The above and other advantages of the invention will become more apparent from the following description taken in conjunction with the accompanying drawings wherein like references refer to like parts and wherein:

FIG. 2 is a system diagram of the control according to the invention with speed sensor inputs;

DESCRIPTION OF THE INVENTION

Figure 1:
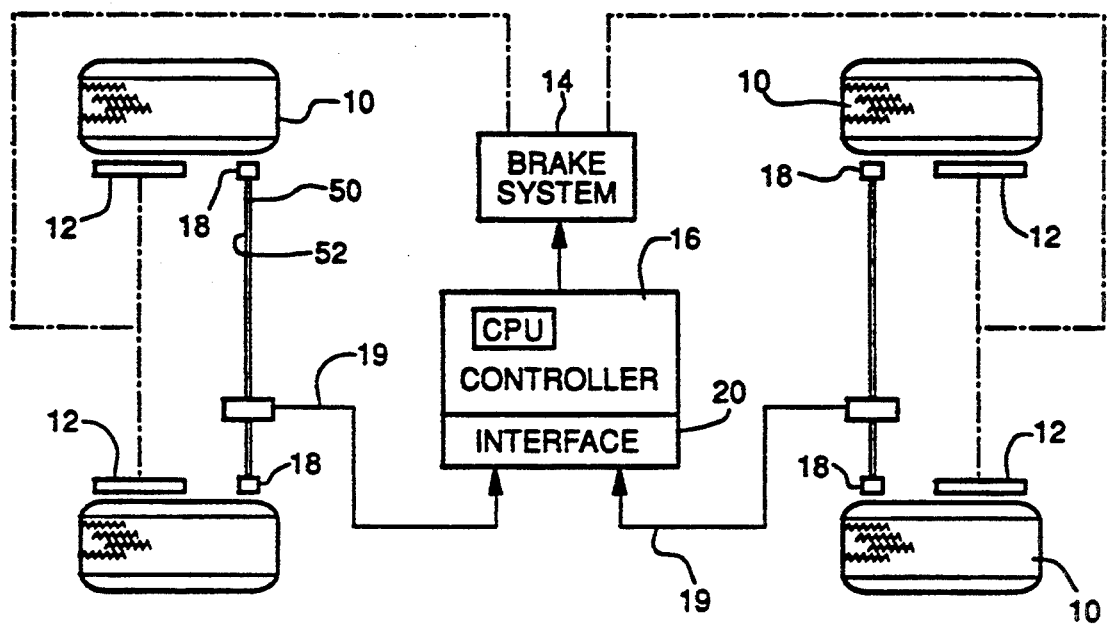
FIG. 1 is a block diagram of an anti-lock brake system according to the invention.

FIG. 1 diagrams an overview of an anti-lock brake system and/or traction control system. Each operates by sensing wheel speed and judiciously applying and releasing brake pressure to attain desired braking performance or traction. Vehicle wheels 10 each have a brake 12 controllably coupled to a brake system 14, which in turn is operated by an electronic controller 16. The controller, including a microprocessor based computer or CPU, resides on a single die or silicon chip. Wheel speed information is provided by conventional gear tooth type variable reluctance sensors 18 which are coupled to the controller 16 through a harness 19 and an interface 20. The harness 19 comprises a high lead and a low lead for each sensor 18 for supplying inputs to the controller.

In FIG. 2 the interface 20 is labeled as Bias and Current Limit. The variable reluctance sensors 18 and the interface are external of the CPU die. A broken line 22 represents the edge of the die and everything to the right of the broken line is on the die and is coupled to the CPU by an address bus and a data bus.

As further explained below, the interface 20 connects the leads of the sensors 18 to a supply voltage and to ground in a way which facilitates diagnosis of the sensor 18 and harness 19 integrity during vehicle operation. Test features block 24 on the die connects to each sensor lead and enables specific test signals to be imposed on each lead for carrying out diagnostic routines when the vehicle is being serviced. The four sets of sensor leads are multiplexed by MUX 26 to two lines 28 and 29. According to the MUX operation the voltages on the four sets of leads are sequentially applied in separate time frames to the lines 28 and 29 and fed to programmable diagnostic circuits and amplifier 30 which operates on the signals of each time frame independently of the others.

The amplifier of the circuit 30 produces an output representing the differential sensor voltages of the sensors which is fed to an analog to digital (A/D) converter 32. The same amplifier produces a common mode voltage for each sensor which is compared to thresholds by the diagnostic circuits to determine whether shorts occur in any sensor or harness, or whether noise biases the common mode voltage beyond acceptable limits. In either case a lockout line 34 suspends A/D operation to prevent transfer of the aberrant signal to the following stage. The same line triggers a fault timer and latch 36 which latches a short fault signal when a time limit expires. The voltages of each lead are also compared to other thresholds to identify an open circuit condition in the sensor or harness. An open signal on line 38 also triggers the fault timer and latch 36 which latches an open fault signal when the open signal persists for a different time period. The thresholds and the time periods are programmable.

The A/D converter 32 samples the analog output of the circuit 30 once each time frame and stores the digital equivalents in a different register (shown in FIG. 4, at 33) for each sensor. A state machine 40 retrieves the samples from the registers and processes them according to an algorithm which converts the nominal sine wave input to digital square waves of the same frequency by a process of seeking peaks and valleys and identifying a square wave edge when the input goes below a peak or above a valley by a hysteresis value.

A programmable test features block 42 normally passes the square waves from the state machine 40 to a timing circuit 44 for registering the time of occurrence of each edge and counting the number of edges which have occurred, so that the control algorithm can compute wheel speed. In test mode, the test features block can select either of two methods of testing the timing circuit 44. According to one test method square waves of known frequency are fed to the timing circuit by the test features block 24 and the CPU determines whether the timing circuit correctly determines the known wheel speed. In another test method the square waves from the state machine are fed to the timing circuit 44 in the usual manner and the test features block 42 also feeds the same square waves via a MUX 46 to a redundant timer 48 which uses a different algorithm to calculate wheel speed; then the CPU makes a comparison of the two calculated wheel speeds to verify the integrity of the timing circuit 44.

Figure 3:
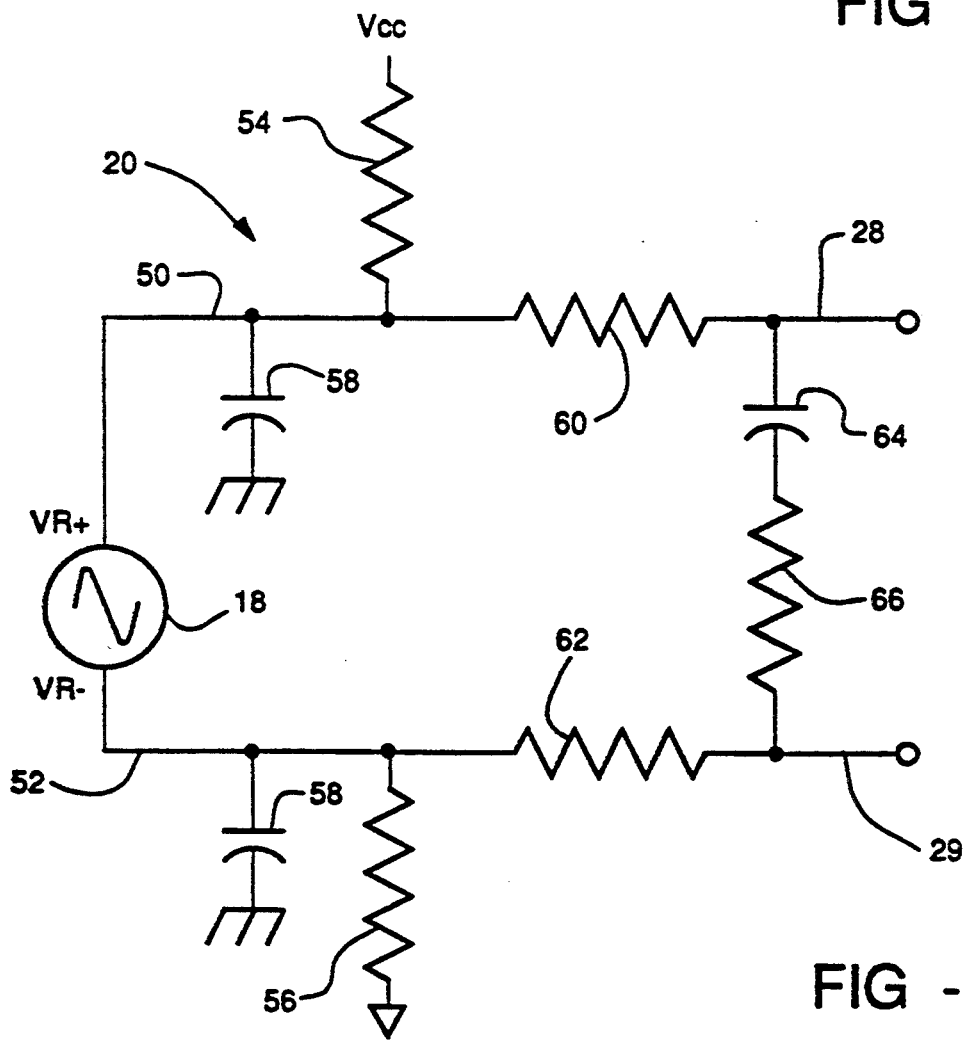
FIG. 3 is a schematic diagram of a sensor biasing circuit useful for diagnostics.

FIG. 3 shows details of the interface 20 and its connection via the leads 50 and 52, which comprise the harness 19, to a variable reluctance sensor 18. A regulated supply voltage Vcc, typically 5 volts, is connected via a bias resistor 54 and a high voltage lead 50 to the high side of the sensor, and the low side is connected through low voltage lead 52 and another bias resistor 56 to ground. The bias resistors are equal and have a value of typically 24 Kohms so that the sensor is biased at Vcc/2. Very small capacitors 58 are connected between the leads 50, 52 and ground for RF decoupling.

A differential filtering circuit comprises resistors 60 and 62 in the leads 50 and 52 to define output leads 28 and 29, respectively, and a capacitor 64 and a resistor 66 serially connected across the leads 28, 29. The resistors 60, 62 each have a value of about 36 Kohms and the resistor 66 is at least 2K. The filter is a lag compensated filter for approximately offsetting the sensor voltage increase with frequency. This allows the DC hysteresis in the squaring circuitry to closely match the processed signal. The filter resistors 60 and 62 also serve a clamp current limiting function. Biasing the sensor by the resistors 54 and 56 allows for open circuit detection. If the sensor leads or the sensor's windings should open, the low voltage output lead 29 will go to its negative clamp voltage and stay there. Likewise, the high lead 28 will go to the positive clamp voltage.

Figure 4:
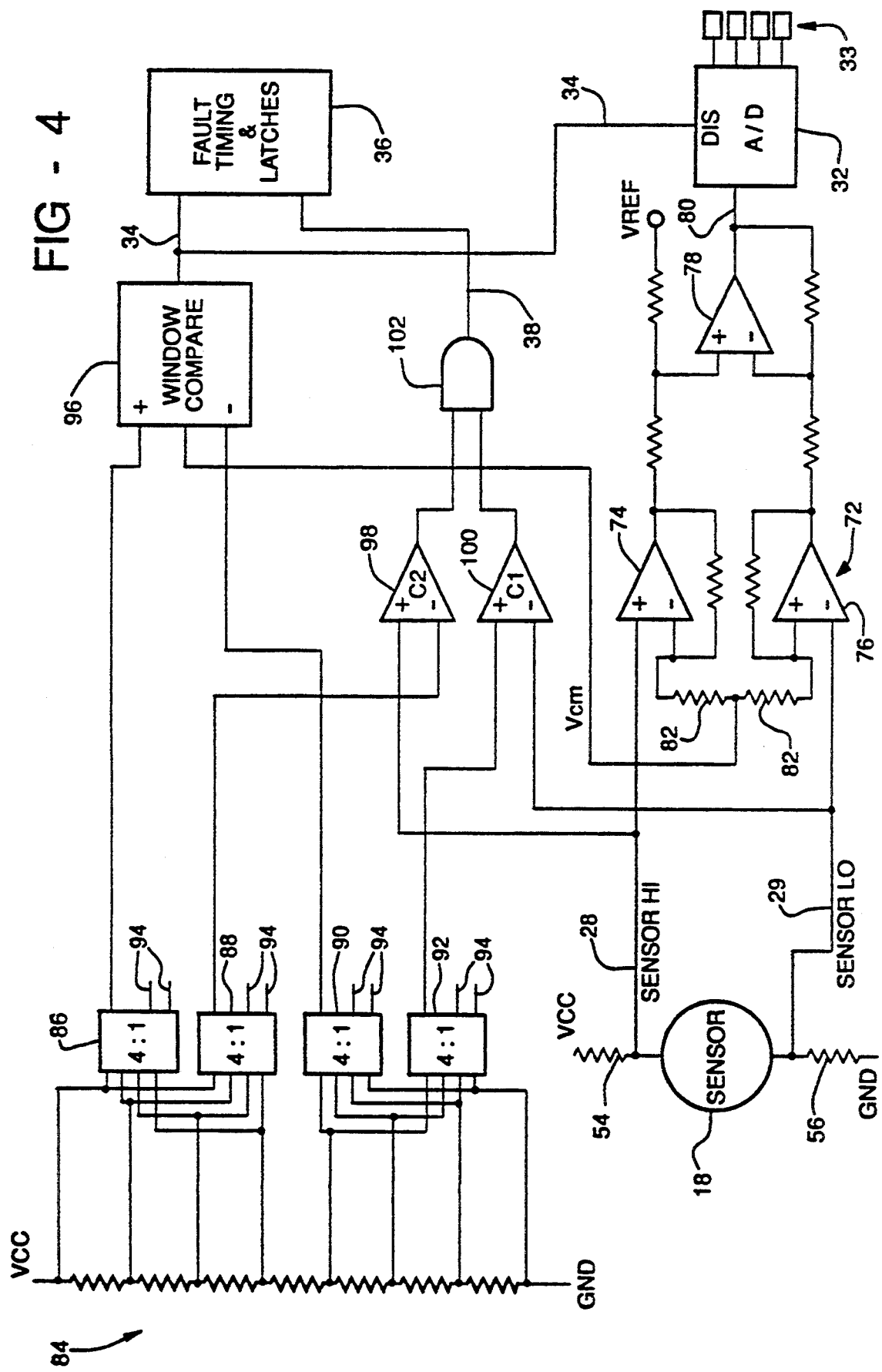
FIG. 4 is a schematic diagram of the programmable diagnostic circuits and amplifier, according to the invention.

FIG. 4 shows a sensor 18 coupled to the programmable diagnostic circuits and amplifier 30, omitting the filtering circuit of FIG. 3, the test features circuit 24 and the MUX 26. An instrumentation amplifier 72 has two input operational amplifiers 74 and 76, each with one input connected to sensor output lead 28 or 29, and an output operational amplifier 78 having inputs coupled to the amplifiers 74 and 76 and to a positive bias voltage Vref. The output 80 of the amplifier 78 comprises the alternating sensor differential voltage imposed on the voltage Vref which assures that the output will remain in a positive range. Each of the operational amplifiers has a feedback resistor from its output to an input, and a pair of equal gain resistors 82 in series couples inputs of the two input amplifiers 74 and 76. The junction of the resistors 82 is at the common mode voltage $V_{cm}=V_{cc}/2$. Thus the instrument amplifier has not only the differential output but also the common mode output.

FIG. 4 further shows a voltage divider 84 between Vcc and ground with six intermediate voltage taps. Vcc and the three highest taps (e.g. 4.25, 3.5, and 2.75 volts) are coupled to each of a pair of demultiplexers or analog switches 86 and 88, while the three lowest taps (e.g. 0.75, 1.5, and 2.25 volts) and ground are coupled to each of switches 90 and 92. Each of the switches 86–92 has two control inputs 94 responsive to control bits stored in registers by the CPU for selecting which of the input voltages become outputs. The outputs of switches 86 and 90 provide high and low threshold voltages to a window comparator 96. The comparator 96 input is the common mode voltage Vcm from the instrumentation amplifier. The comparator 96 output signifies a short condition and is coupled via line 34 to the fault timing and latching circuit 36 and to the disable function of the A/D converter 32. The output of switch 88 becomes a threshold voltage for a comparator 98 having the sensor high lead voltage on line 28 as its other input. Likewise, the output of switch 92 is a threshold voltage for a comparator 100 which has the sensor low voltage on line 29 as its input. Thus each comparator threshold is programmable, determined by control bits stored in registers. An AND gate 102 has inputs coupled to the comparators 98 and 100 and an output to the fault timing circuit 36 for indicating an open circuit condition. The fault timing circuit has separate timeout settings, both programmable by software, for short and open conditions and latches a fault when a respective open or short condition exceeds its time limit. The range of selectable timeout periods for a short fault is, for example, between 15 and 244 usec, and the range of timeouts of an open fault is, for example between 4 and 500 msec. For diagnosing shorts during vehicle operation, the short timeout may be set to about 100 usec.

In operation the sensor 18 is biased by pulling up the lead 28 to Vcc and pulling down the lead 29 to ground. If the sensor or wire harness becomes open circuited the high lead 28 will go toward Vcc and the low lead 29 will go toward ground and stay there. These lead voltages are monitored by the comparators 98 and 100. When the high lead voltage goes above the comparator 98 threshold and the low lead voltage goes below the comparator 100 threshold, both comparators turn on to send an open indication to the fault timing circuit 36 via AND gate 102 and the timeout period begins. If the timeout expires an open circuit fault is latched. A variable reluctance sensor output voltage increases with frequency. Since the input may routinely exceed the comparator thresholds for higher frequency and higher voltage inputs, the timing of the open circuit detection must be long enough to eliminate normal high voltage sensor outputs. Low frequency inputs do not have enough voltage to exceed the comparator thresholds. If the sensor has a short to ground or to battery, its common mode voltage Vcm will no longer be Vcc/2. Therefore to detect a short to ground or battery, the window comparator compares Vcm to the high and the low thresholds. If either threshold is violated the output of the window comparator signifies a short condition and the timer for a short condition begins. If the short timeout period expires, a short fault is latched. The probable consequence of latching either fault is that the control system is disabled and a warning message advises the operator to have the vehicle serviced. Prior to latching a fault, a short fault indication on line 34 is fed to the A/D converter to prevent digitizing the differential signal on line 80.

The programmability of the thresholds and the times has a number of advantages. An open sensor may not necessarily be infinite resistance and a short is not always zero ohms. Thus there is a decision to be made as to what constitutes a fault, and this may depend on the circumstances. For example, if a sensor harness has an extra 2 Kohms to 3 Kohms resistance when the vehicle is assembled, it is probably a problem, but if the vehicle is quite old, it probably is not a problem. Thus for initial testing of a new vehicle the programmable fault thresholds and timeout periods should be set for tight tolerances to discover any latent defect and avoid customer dissatisfaction. If a service technician is trying to find a harness problem, the ability to program the parameters through a diagnostic computer will allow him to discover whether to look for a hard short or perhaps a corroded connection. When the vehicle is in service, the parameters should be set to nominal values to adequately diagnose the harness/sensor system without undue sensitivity.

The output of the instrumentation amplifier 72 on line 80 is the differential of the input leads provided that the input signals stay within their input common mode range. If the inputs stray outside the common mode range the amplifier's output can not be predicted. That is, the amplifier may have an output other than the input differential. Such a problem occurs when a common mode pulse is induced on the sensor leads, perhaps by a current spike in a conductor near the leads. Then a spike will appear in the output on line 80. Such a contain mode pulse, if passed through the system to the wave squaring circuit, could produce extraneous edges. The extraneous edges will, of course, generate false wheel speed information. The diagnostic circuit described above is used to lock out such a common mode pulse. The window comparator is not limited to detecting shorts, rather it detects any signal aberration which causes the common mode voltage to violate either threshold. Thus the common mode pulse is detected by the window comparator 96 to produce an output on line 34 which is coupled to the A/D converter 32. The A/D converter responds to the signal by suspending digital conversion of the line 80 voltage and maintaining the digital output which existed in the respective register 33 prior to the common mode pulse.

To determine sensor and harness resistance as a service procedure it is not necessary to disconnect the harness from the controller and evaluate the harness with an ohmmeter; rather the controller itself can be used as an ohmmeter. In particular, when the wheels are stationary, the supply voltage Vcc applied to the sensors 18 via the leads 50, 52 of the harness 19 develops a voltage which is a function of the bias resistors 54 and 56, and the combined resistance of the sensor winding and the leads 50 and 52. If the resistance of the sensor or harness changes, the differential voltage changes accordingly. For each sensor 18 the differential voltage is sensed by the amplifier and changed according to a transfer function by the amplifier voltage gain A and an offset due to the reference voltage Vref. The amplifier output is digitized by the A/D converter 32 which also has a transfer function preferably comprising the digital value of 255 corresponding to the voltage Vcc. The digital value is stored in a register 33 for each sensor for access by the state machine 40. The CPU has access to the registers. Commonly service personnel use computerized diagnostic equipment which communicates with electronic devices on board a vehicle, and such equipment can be used to access the A/D converter register 33 contents. Thus the digitized values of the differential sensor voltage are retrieved for evaluation of sensor and harness resistance. The relationship of the digitized output voltage Vo to the sensor and harness resistance Rs is expressed by $$Vo = [(Vcc*Rs*A)/(Rb+Rs) + Vref]*C/Vcc$$

where Vcc is the supply voltage, A is the amplifier gain, Rb is the bias resistance, Vref is the amplifier offset, and C is the number of digital counts over the range of the supply voltage Vcc. Since typically Rs is the only variable, changes in Vo will be proportional to Rs/(Rb+Rs). As a specific example, for Rs=2000 Kohm, Rb=48,000 Kohm, Vcc=5 v, Vref=1.7 v, and C=255, Vo is 117.3. If the tolerance limits on a sensor 18 at room temperature are 1.8 Kohm to 2.3 Kohm, the digital value Vo could be between 114 and 121 counts. Any reading outside that range is not nominal. The other voltage and resistance parameters in the equation may have some tolerance which affects the digital count bat still this method is very accurate for determining that the sensor/harness assembly is correct.

While the present invention has been described in reference to the illustrated embodiment, it will be understood that the scope of the invention is limited only by the appended claims.

The embodiments of the invention in which an exclusive property or privilege is claimed are defined as follows:

1. In a control system for vehicle wheels, the system having a plurality of wheel speed sensors each coupled by a pair of leads to a common controller circuit; a method of indicating the resistance of each sensor and associated leads, comprising the steps of:
   biasing each sensor by applying a supply voltage to a series combination of the sensor, the associated leads and a bias resistance;
   sensing differential voltages across the leads of each sensor when the vehicle wheels are stationary;
   storing the differential voltages for each sensor; and
   utilizing the stored voltages as an indicator of the respective sensor and lead resistances.

2. The invention as defined in claim 1 wherein the stored voltages each vary as a function of Rs/(Rs+Rb), where Rs is the sensor and lead resistance of a respective sensor and Rb is the bias resistance.

3. The invention as defined in claim 1 wherein the step of storing differential voltages for each sensor comprises digitizing the sensed differential voltages and separately storing a digital value for each sensor.

4. In a control system for vehicle wheels, the system having a plurality of wheel speed sensors each coupled by a pair of leads to a controller circuit, the controller circuit including a differential amplifier coupled to the sensor leads and having a voltage output which is a transfer function of a sensor voltage differential, circuitry for measuring wheel speeds including an analog to digital voltage converter for digitizing the amplifier voltage output, and computer means for accessing the digitized output for anti-lock brake control; a method of indicating the resistance of the sensor and leads for diagnostic purposes comprising the steps of:
   biasing each sensor by applying a known supply voltage to a series combination of the sensor, leads and a bias resistance; and
   acquiring the digitized output for a given sensor when the vehicle wheels are stationary, wherein the digitized output is an indicator of the sensor and lead resistance and is a function of the sensor resistance, the supply voltage, the bias resistance, the converter, and the transfer function of the amplifier.

5. In a control system for a plurality of wheel speed sensors each coupled by a pair of leads to a controller circuit, the controller circuit including a differential amplifier coupled to the sensor leads and having a voltage output based on a sensor voltage differential, a gain and an offset voltage, circuitry for measuring wheel speeds including an analog to digital converter for digitizing the amplifier voltage output, and computer means for accessing the digitized output for anti-lock brake control, a method of indicating the resistance of the sensor and leads for diagnostic purposes comprising the steps of:
   biasing each sensor by applying a known supply voltage to a series combination of the sensor, leads and a bias resistance; and
   acquiring the digitized output for a given sensor when the vehicle wheels are stationary as an indicator of the sensor and lead resistance, such output being a function of the sensor resistance, the supply voltage, the bias resistance, the converter, the amplifier gain and offset voltage, wherein the converter digitizes the amplifier output voltage into a digital range corresponding to the supply voltage.

6. The invention as defined in claim 5 wherein the relationship of the digitized output varies as a function of [(Vcc*Rs *A)/(Rb+Rs)+Vref]*C/Vcc where Rs is the sensor and lead resistance, Vcc is the supply voltage, A is the amplifier gain, Rb is the bias resistance, Vref is the amplifier offset, voltage and C the digital range of the converter.

* * * * *